US010685778B2

(12) United States Patent
Klaponski et al.

(10) Patent No.: US 10,685,778 B2
(45) Date of Patent: Jun. 16, 2020

(54) INTRA-TANK UNDER-OIL VACUUM PRIMARY SWITCHES FOR MEDIUM VOLTAGE TRANSFORMER APPLICATIONS

(71) Applicants: Carte International Inc., Winnipeg (CA); Quality Switch, Inc., Newton Falls, OH (US)

(72) Inventors: Brian Klaponski, Winnipeg (CA); Ralph Wegner, Winnpeg (CA); Garth Norberg, Winnipeg (CA); Joseph H. Groeger, Storrs, CT (US); Jeremy Sewell, Southington, OH (US); Larry Dix, Cortland, OH (US); Adam Sewell, Warren, OH (US); Doug Senne, Warren, OH (US); Frank DePuy, Youngstown, OH (US)

(73) Assignees: Carte International Inc., Winnipeg (CA); Quality Switch, Inc., Newton Falls, OH (US)

( * ) Notice: Subject to any disclaimer, the term of this patent is extended or adjusted under 35 U.S.C. 154(b) by 116 days.

(21) Appl. No.: 15/485,364

(22) Filed: Apr. 12, 2017

(65) Prior Publication Data

US 2018/0301279 A1 Oct. 18, 2018

(51) Int. Cl.

| | |
|---|---|
| ***G01R 31/02*** | (2006.01) |
| ***H01F 27/40*** | (2006.01) |
| ***H01F 27/12*** | (2006.01) |
| ***H01F 27/20*** | (2006.01) |
| ***H01F 27/02*** | (2006.01) |
| *H01H 33/662* | (2006.01) |
| *H01H 33/666* | (2006.01) |

(52) U.S. Cl.

CPC ............ *H01F 27/40* (2013.01); *H01F 27/02* (2013.01); *H01F 27/12* (2013.01); *H01F 27/20* (2013.01); *H01H 33/666* (2013.01); *H01H 33/66207* (2013.01)

(58) Field of Classification Search

USPC .......................... 324/424, 547; 218/118, 138

See application file for complete search history.

(56) References Cited

U.S. PATENT DOCUMENTS

| | | | | |
|---|---|---|---|---|
| 5,623,891 | A * | 4/1997 | Miller | G01L 19/12 116/268 |
| 5,661,280 | A | 8/1997 | Kuss et al. | |
| 5,892,645 | A | 4/1999 | Watanabe et al. | |
| 7,142,410 | B2 | 11/2006 | Norris et al. | |
| 7,961,073 | B2 | 6/2011 | Ying | |
| 9,006,595 | B2 | 4/2015 | Craig | |

(Continued)

*Primary Examiner* — Vincent Q Nguyen

(74) *Attorney, Agent, or Firm* — Carmody Torrance Sandak & Hennessey LLP

(57) ABSTRACT

A controllable primary switch for isolating a transformer from a power grid or network. The controllable primary switch is mountable within and integral to the transformer and is electrically connected to high voltage feeder cables to allow the transformer to be disconnected from the power grid or network. The controllable primary switch includes one or more vacuum interrupters having first and second electrical switch contacts mounted inside the casing, an actuator for moving the second switch contact relative to the first switch contact in each of the one or more vacuum interrupters, and a handle connected to the actuator. The handle engages the actuator to move the second switch contact relative to the first switch contact.

17 Claims, 12 Drawing Sheets

(56) References Cited

U.S. PATENT DOCUMENTS

| | | | | |
|---|---|---|---|---|
| 9,136,077 | B2 | 9/2015 | Hu et al. | |
| 2002/0179571 | A1 * | 12/2002 | Rhein | H01H 33/6662 218/7 |
| 2006/0165023 | A1 | 7/2006 | Faulkner et al. | |
| 2010/0276395 | A1 * | 11/2010 | Gardner | H01H 33/66207 218/138 |
| 2013/0158897 | A1 * | 6/2013 | Jain | G01R 31/027 702/42 |
| 2013/0182355 | A1 * | 7/2013 | Coca Figuerola | H01F 27/402 361/35 |
| 2013/0206728 | A1 * | 8/2013 | Martin | H01H 33/662 218/139 |
| 2015/0047954 | A1 * | 2/2015 | Elick | H01H 3/3015 200/11 TC |
| 2015/0102608 | A1 * | 4/2015 | Kim | H01H 9/22 292/140 |

* cited by examiner

INTRA-TANK UNDER-OIL VACUUM PRIMARY SWITCHES FOR MEDIUM VOLTAGE TRANSFORMER APPLICATIONS

FIELD OF THE INVENTION

The present invention relates generally to primary switches used for controlling, protecting, and isolating transformers and other electrical apparatuses in a power distribution network.

BACKGROUND OF THE INVENTION

Electrical power systems operated by electrical utility firms and the like typically include a large number of transformers, capacitor banks, reactors, motors, generators and other major pieces of electrical equipment often interconnected with heavy duty cabling and switching devices for connecting and disconnecting the equipment to the network. Protective devices, including, but not limited to, fuses, circuit breakers, limiters, arrestors, and protective relay devices can be connected to the major pieces of equipment and are designed to open and close circuitry in the power system when fault conditions occur to protect the system from damage.

Electrical power is transmitted from substations through cables, which interconnect other cables and electrical apparatus in a power distribution network. Electrical components such as power distribution capacitors and transformers are interconnected in the network via high voltage cables, and a variety of switchgear is used to connect and disconnect power connections to the components and associated circuitry. Power switches have been used for many years to connect and disconnect power sources to loads.

Transformers are used extensively in the transmission and distribution of electrical power, at both the generating end and the customer's end of the power distribution system. Such transformers include, for example, distribution transformers that convert high-voltage electricity to lower voltage levels acceptable for use for commercial and residential customers. These include network transformers that supply power to grid-type or radial secondary distribution systems in areas of high load density. These areas of high load density include, for example, underground, metropolitan vault applications, government, commercial, institutional and industrial facilities, and office towers and skyscrapers.

Transformers are generally configured to include a core and electrical conductors that are wound around the core so as to form at least two windings (or coils). These windings or coils are typically installed concentrically around a common core of magnetically suitable material such as iron and iron alloys and are electrically insulated from each other. The primary winding or coil receives energy from an alternating current (AC) source. The secondary winding receives energy by mutual inductance from the primary winding and delivers that energy to a load that is connected to the secondary winding. The core provides a circuit for the magnetic flux created by the alternating current flowing in the primary winding and includes the current flow in the secondary winding. The core and windings are typically retained within an enclosure or tank for safety and to protect the core and coil assembly from damage. The tank also provides a clean environment, free of moisture. The tank is typically filled with an insulating fluid that provides electrical insulation function, while also serving to conduct heat from the core and coil assembly to the tank surface or cooling panels. Connections between the feeder cables and transformer core are made through under-oil bushings.

Network transformers receive power at a higher distribution voltage and provide electric power at a lower voltage to a secondary network and can include multiple switching devices. One switching device is located on the primary side (incoming power feed). This is typically a high voltage, between 13,000 volts (13 kV) and 35,000 volts (35 kV). Another switching device is on the load (customer) side and is most often designed for three-phase 120/208 volts or 277/480 volt service. The switch on the secondary side is identified as a network protector. This is a 'smart' switch that includes network condition assessment (i.e., load support required, network dead, network with low impedance ground path, etc.) plus sensing that there is or is not a primary voltage source applied to the transformer. This network protector also includes fuses for a secondary level of protection for the transformer.

Power is fed to the transformer at a high voltage level, through a plurality of high voltage cables. This is referred to as the 'primary' power and the cables are often referred to as 'feeder' cables. Converted power then exits the transformer through low voltage cables, which are connected to a network protector, comprising a switch on the low voltage side of the transformer.

The feeder cables and low voltage cables include electrical connection to a primary switch that allows the transformer to be disconnected and/or grounded for maintenance and testing operations in addition to network or feeder maintenance and repair activities. This 'primary' switch is used to control, protect, and isolate the transformer as needed. This primary switch can be mounted proximate, within, or adjacent to a network transformer and comprises a device that includes a mating pair of electrical contacts for each phase, one being stationary and one being movable, that open and close the circuit. Unless located within the transformer tank, these switches are enclosed within a separate steel housing or a housing that is part of the transformer tank, but isolated by a shared wall.

The primary switch is typically a manually-operated device with under-oil non-shielded electrical contacts. The oil, also referred to as an insulating fluid when based on non-mineral hydrocarbons, may be shared or isolated from the oil or insulating fluid used for the transformer core and coil assembly. The switch has a handle that protrudes from the transformer tank or from the independent tank. The switch may have a two-position operating mechanism or a three-position operating system. The two-position switch has a 'ground' or 'clear' position that either grounds the primary power and short-circuits the transformer primary windings or removes the shorts and grounding, thus allowing primary power to flow to the transformer ('clear'). The three-position switch includes 'open', 'closed', and 'ground' positions. These positions connect the primary power supply to ground ('ground'), isolate the primary power from the transformer ('open'), or connect the primary power to the transformer ('closed'). The 'ground' position is used for safety when the primary supply is disconnected. This safety ground prevents an accident if the primary supply is inadvertently switched on from a remote location (such as a substation).

The primary switch can be included directly in the main tank of the transformer or in an attached, smaller tank with its own oil, where the oil inside the switch is completely isolated from the oil inside the transformer tank. The location of the switch within a separate tank developed from an older design, in which the primary cables were insulated with oil and paper. These primary cables enter the tank for connection to the switch, through which contact is made with the core and coil assembly.

FIG. 1 depicts a network transformer of the prior art that comprises separate compartments for the primary cable connections and primary switch. As can be seen from FIG. 1, the unit is much more bulky than desired, which can be a major problem where space inside the transformer vault is limited.

Mounting the primary switch within the transformer tank reduces the overall footprint of the transformer. When the primary switch is mounted within the transformer tank and under the oil in the tank, the non-shielded switch contacts are exposed to the oil within the transformer tank. The primary cable connections are typically positioned on the upper surface or wall of the tank and connections are made with separable molded rubber connectors or with bolted connections within molded rubber housings. The primary switch handle is mounted on the upper surface of the tank or wall and the movement between switch positions is through a horizontal or vertical arc. The switch handle typically includes provision for a padlock to protect against inadvertent or unintended switch operation, and the lock key may be held by a supervisor, for example. Primary switches mounted in a separate housing are typically manually-operated through a vertical arc.

A failure of one or more of the major pieces of electrical equipment may require costly and time consuming delays in restoring power to customers. Failure of one or more of the major pieces of equipment may also present hazardous conditions to nearby persons and equipment. This is especially true for equipment and switchgear including components immersed in liquid dielectric fluid (oil) within a closed tank.

The primary switch is a known point of concern and risk when operating network transformers. If the switch fails, breaks, or is operated incorrectly, the risk of an under-oil arcing event is significant. Due to the high energy density, the under-oil arcing generates a large volume of oil vapor and combustible gases that can rupture a transformer tank, leading to an explosion and subsequent fire.

There are also a number of risks associated with manual primary switch operation. Firstly, the operator may not move the switch in a smooth, continuous manner, which can lead to incorrect seating of the contacts or arcing between almost-closed or almost-open contacts. In addition, the switch can become broken if the operation exceeds a stop limit or if the contacts become welded together due to heating from slow operation, for example. The switch may also be operated when the conditions are not appropriate. Finally, the operator may force operation of a damaged switch, especially since the switch contacts are not visible to the operator. These switches are normally secured with a padlock. It is during periods where the switch is unlocked and manual operation is required that increased risks arise.

To reduce risks associated with primary switch operation, some utility companies have resorted to remote switching through rope and pulley systems, for example, to allow operation of the primary switch handle from a location remote from the vault. However, this is a crude system that lacks tactile feedback and requires maintenance. The practice is not widespread, even though the risks from switch operation within a confined vault are known and significant.

More recently, some utility companies have adopted a separate, remotely-operable primary switch for their network transformers, which can include vacuum interrupters housed within a separate cabinet that is independent of the transformer tank. The separate cabinet is typically wall-mounted inside the transformer vault. These switches require re-routing of the shielded medium voltage primary feeder cables directly to the switch, with additional shielded medium voltage cables connected between the switch and transformer. However, the primary cables may not have sufficient length for addition of this type of switch and the available vault space is typically very limited. Preparation of medium voltage cable terminations is time-consuming and requires significant skill. The additional cables that run between the external switch and transformer consume available space and may impede access and escape paths in crowded vaults. Because these are rated for medium voltage applications, they have a large diameter and a large minimum allowable bending radius. These separate disconnect switches include a motor-operator or electromechanical operator.

When the primary switch is included within the transformer tank and submerged under the oil within the tank, the switch chamber is not added as an appendage to the main tank, but instead the switch contacts are bare and exposed to the oil within the transformer tank. Thus, a failure in this area can lead to a major electrical 'event' within the transformer tank if arcing develops and is sustained, which can cause damage to the switch, along with the core and coil transformer components. Furthermore, in some instances, failure can also cause the tank itself to rupture, potentially leading to fires and explosions.

Other configurations use a switch that is mounted on the wall of the vault, outside of the transformer tank, to fully isolate the switching function. This is a growing trend and a reaction to past primary switch 'events' and related concerns regarding an oil-filled switch in a confined vault where rapid egress is impossible if there is an 'event'. In some cases, these external switches are also being added to allow remote operation, consistent with "smart grid" technology. The term "remote operation" generally means that the switch can be operated from outside of the vault, which can be as simple as a local control scheme for operation or as complex as a centralized system control communications network. The goal is to isolate personnel from the switching operation, including under-oil switches that are installed within the transformer.

However, the use of a separate primary switch adds complexity to the transformer system, with the need to run three feeder cables to the primary switch and then three more feeder cables from the switch to the transformer. Grounding connections are also required for the switch and transformer. Because of the high voltage requirements, complicated end fittings or terminations must be carefully installed for proper electric stress control.

A wall-mount switch encroaches on the valuable space in the vault, since most vaults are designed to contain the transformer, while allowing limited personnel access for maintenance and repairs, with limited provision for additional equipment. Thus, the additional cables greatly complicates the vault layout, further challenged by the limited bend radius of the feeder cables. In many cases, it is also not possible to add an external switch due to the size and layout of the vault. Finally, an external switch also adds to the inspection and maintenance burden. Vaults cannot be expanded without significant and costly encroachment on civil infrastructure.

FIG. 2 shows a top-down view of a typical vault. As can be seen from FIG. 2, the transformer is mounted against one wall and there is no available space at the primary connection end for a separate primary switch that would not significantly block personnel access or escape routes.

FIG. 3 depicts an example of a separate primary compartment mounted to a network transformer. FIG. 4 shows some of the internal switch components that correspond to this design. However, it is not believed that a separate switch compartment could be made fault-tolerant as well as the main tank, because the stiffening effect of the separate primary switch compartment would compromise the design basis of a fault-tolerant main tank, for example.

Thus, it can be seen that there remains a need in the art for an improved primary switch that can be used for controlling, protecting, and isolating transformers and other electrical apparatuses in a power distribution network and that overcomes the deficiencies of the prior art.

Vacuum interrupters were developed in the late 1960s for power switching applications and have been used in various switches, circuit breakers and other electrical power devices, including, for example, tap changers, reclosers, and as loadbreak switches.

Tap changers' are devices that are used for the momentary interruption of voltage in a power transformer between incremental changes from one tap to the next. Tap changers are typically used on the high voltage tap winding of medium voltage transformers and are not used for isolating the incoming electrical supply of the transformer.

'Reclosers' are switching devices that are used for power restoration and represent a specialized switch that is used to restore power to overhead or underground radial lines following an outage that may be caused by line contact with tree branches or wildlife, or a lightning strike, for example. Thus, the recloser is used to isolate power to a line when there is a fault condition, and then attempt to reconnect a fixed number of times to automatically restore power. The recloser is limited to switching operations. Reclosers do not contain any transformative features.

U.S. Pat. No. 8,284,002 to Heller et al., the subject matter of which is herein incorporated by reference in its entirety, describes a current interrupter switch for power distribution systems in which the switch is configured to fit though existing vault access holes (which are typically about 30 inches in diameter). This current interrupter switch is used as a 'drop-in' replacement for lower voltage oil switches and is mounted on a wall of the vault. This switch element is manually pushed in or pulled out between two electrically conductive terminals, one of which is connected to a common bus and the other of which is connected to the underground circuit. When inserted between the terminals, the switch electrically couples the terminals, completing the circuit and energizing the underground circuit. When manually pulled from the terminals, the switch breaks load current, 'opens' the circuit, and de-energizes the underground circuit.

U.S. Pat. No. 9,136,077 to Hu et al., the subject matter of which is herein incorporated by reference in its entirety, describes the use of three-phase, multi-way submersible loadbreak vacuum interrupter switchgear designed to replace oil-insulated and $SF_6$ gas-insulated switchgear used in three-phase power distribution systems. The switchgear comprises a combination of electrical disconnect switches, fuses, or circuit breakers, and is used to control, protect or isolate electrical equipment for the distribution of reliable electricity within a power system. The switchgear is used to both de-energize the equipment to allow work to be conducted and to clear faults and to distribute power to different areas within the system. However, there is no indication that this type of switch assembly could be incorporated within a transformer tank for electrical connections with feeder cables and low voltage cables to isolate the transformer and allow the transformer to be disconnected from a power grid or network.

While various switch configurations have been suggested and are described in the prior art, some of which are noted above, there remains a need in the art for an improved intra-tank primary switch that overcomes the noted deficiencies of the prior art. In addition, there also remains a need in the art for an improved transformer tank design that incorporates a primary switch therein to isolate the transformer and allow the transformer to be disconnected from a power grid or network and that overcomes the deficiencies of the prior art.

Furthermore, in the event of natural disasters, such as an earthquake, utility providers may need to discontinue service to various consumers of the utility's service, as described, for example, in U.S. Pat. Pub. No. 2012/0274440 to Meadows et al., the subject matter of which is herein incorporated by reference in its entirety, because continuing to provide the utility service to a damaged or burning structure can further exacerbate the risks to those in the facility as well as emergency responders. Generally, disconnecting the utility service requires that electrical power service be disconnected at the damaged facility. In other instances, the utility may shut off large sections of its distribution system if the damage is widespread. However, doing so may interrupt utility service to areas that are not affected or to areas where the electric utilities are needed to aid with rescue and repair efforts.

Electrical utility providers may also desire to electronically communicate with key control and measurement equipment for numerous purposes including scheduling disconnection or connection of utility services to the metered loads, load shedding and load control, automatic distribution and smart-grid applications, outage reporting, and possibly for providing additional services such as Internet, video, and audio, etc. In many of these instances, in order to perform these functions, the equipment must be configured to communicate with one or more computing devices through a communications network, which can be wired, wireless or a combination of wired and wireless, as known to one of ordinary skill in the art.

In many instances, switching equipment may be designed with an electromechanical operator that can be actuated remotely to perform functions such as disconnection or connection of utility services to the metered loads, load shedding and load control, and the like. These remote switches, as well as switches in the utility's distribution system, can be used to isolate facilities that may have been damaged by seismic activity or other cause. Thus, it would be desirable for a primary switch to have remote capability such that the primary switch may be remotely operated in the event of a natural disaster or other contingency.

Furthermore, while it is known that a damaged facility can be turned off or disconnected from the distribution system, it would also be desirable for a facility to be capable of withstanding damage during a natural disaster such as a seismic event and for the transformer to be capable of continuing to provide services during such an event. This is especially critical in installations such as hospitals where a temporary loss of power can lead to disastrous results. In addition, in earthquake-prone areas it is also desirable that a facility be capable of withstanding seismic events. Thus, it would be desirable to provide a network transformer that is capable of withstanding a seismic event without damage to the transformer and without rupture or fire in the transformer that can lead to outages and loss of life.

SUMMARY OF THE INVENTION

It is an object of the present invention to provide a primary switch for isolating a transformer within a power grid or network It is another object of the present invention to provide a primary switch that allows a transformer to be disconnected from a primary grid or network or grounded for safety reasons.

It is another object of the present invention to provide an improved primary switch for a medium voltage transformer system.

It is another object of the present invention to provide an improved primary switch that can be situated within the transformer tank.

It is still another object of the present invention to provide an improved primary switch that can be situated within the transformer tank yet be isolated from the transformer core and coils and not exposed to the insulating fluid within the tank.

It is still another object of the present invention to provide a primary switch in a transformer system that includes vacuum interrupters.

To that end, in one embodiment, the present invention relates generally to a controllable primary switch for isolating a transformer from a power grid or network, wherein the controllable primary switch is mountable within and integral to the transformer and is electrically connected to high voltage feeder cables to allow the transformer to be disconnected from the power grid or network, the controllable primary switch comprising:

a) one or more vacuum interrupters, wherein each of the plurality of vacuum interrupters comprises:
   i) a sealed casing, the sealed casing comprising a pair of end caps closing the ends of the casing; and
   ii) first and second electrical switch contacts mounted inside the casing, wherein the first switch contact is stationary and the second switch contact is movable relative to the first switch contact;

b) actuator means for moving the second switch contact relative to the first switch contact in each of the one or more vacuum interrupters; and c) a handle connected to the actuator means, wherein said handle is capable of engaging the actuator means to move the second switch contact relative to the first switch contact;

wherein, when the one or more vacuum interrupters are in an 'open' position, the first and second electrical switch contacts are separated from one another, wherein the feeder cables are isolated and no power is conveyed through the transformer and the transformer is isolated from the power grid or network;

wherein one or more vacuum interrupters may be arranged to 'ground' the incoming feeder connection;

and wherein, when the one or more vacuum interrupters are in a closed position, the first and second electrical switch contacts are in contact with each other, wherein the feeder cables are connected to the transformer and power is conveyed through the transformer.

DETAILED DESCRIPTION OF THE PREFERRED EMBODIMENTS

Figure 1:
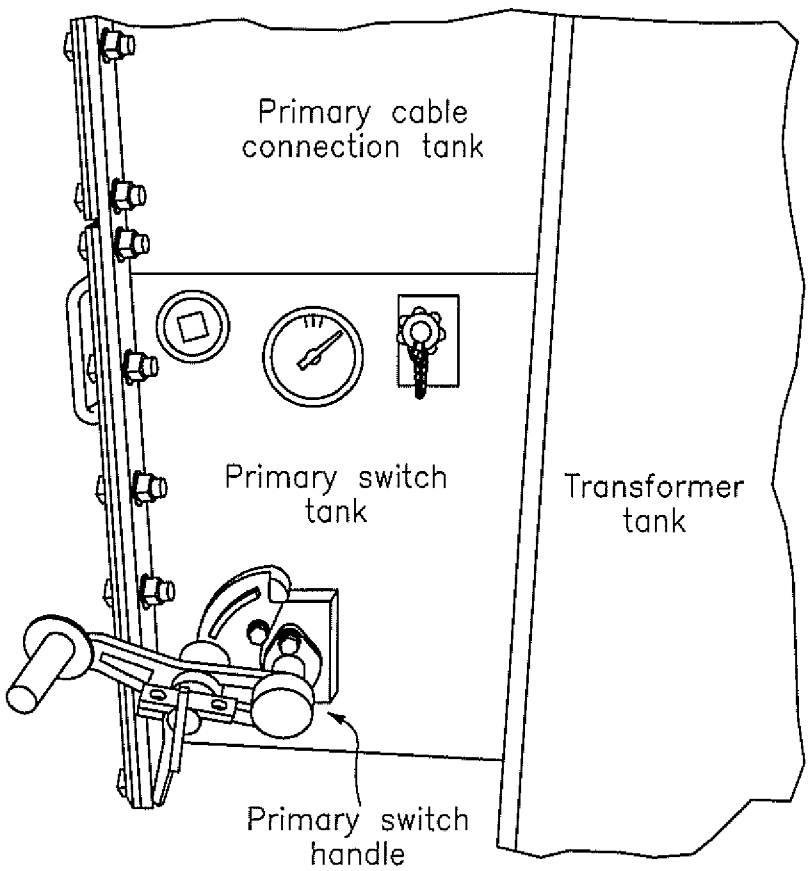
FIG. 1 depicts a network transformer comprising separate compartments for the primary cable connections and primary switch.
Figure 2:
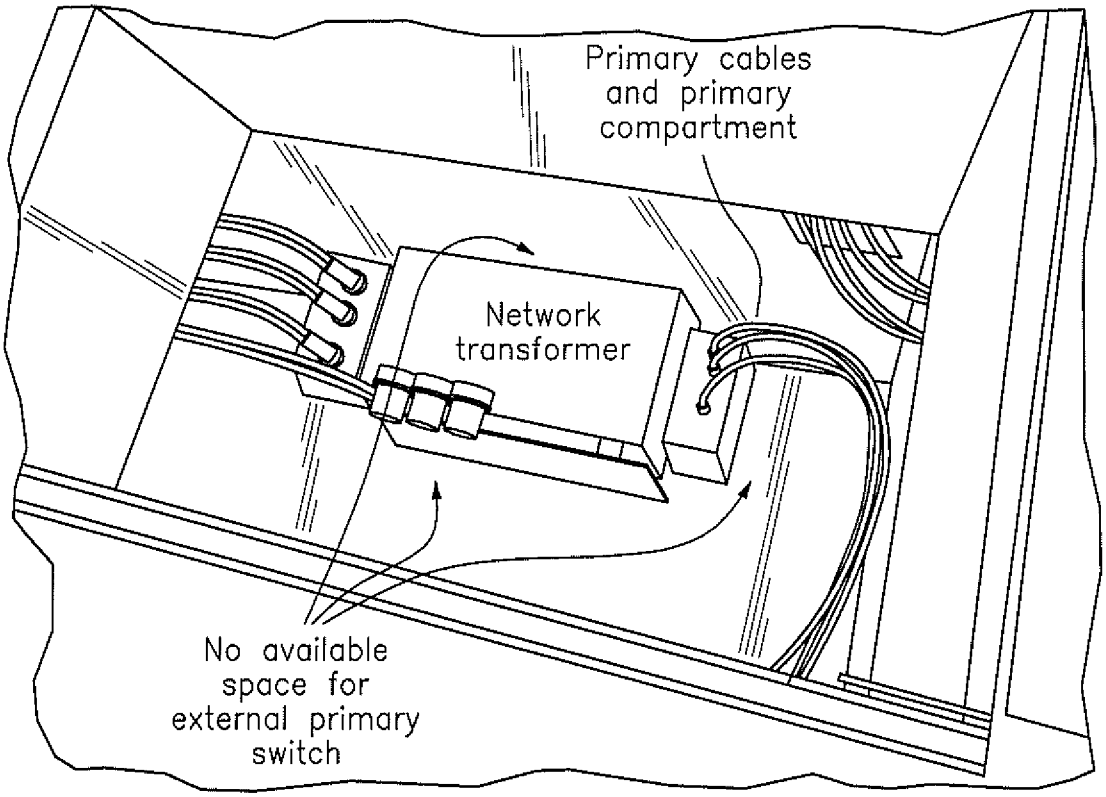
FIG. 2 depicts a top-down view of a vault with a network transformer configured therein.
Figure 3:
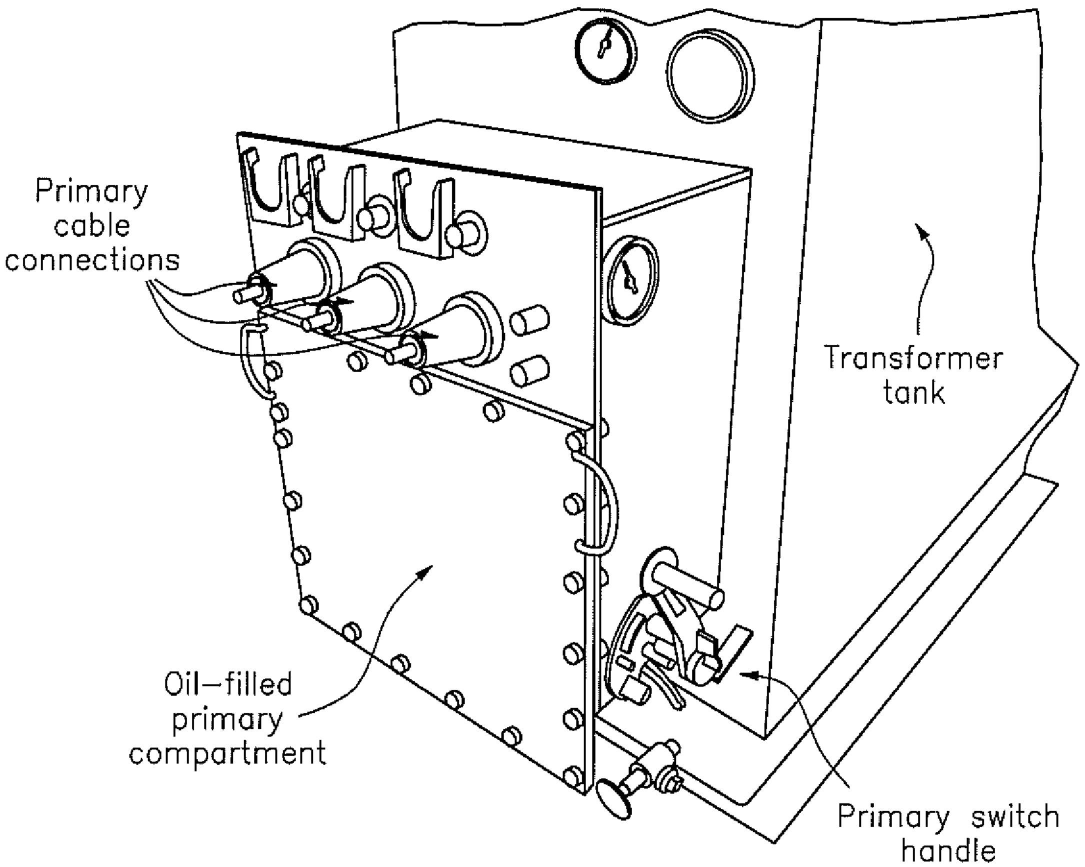
FIG. 3 depicts a separate primary switch compartment mounted to a network transformer.
Figure 4:
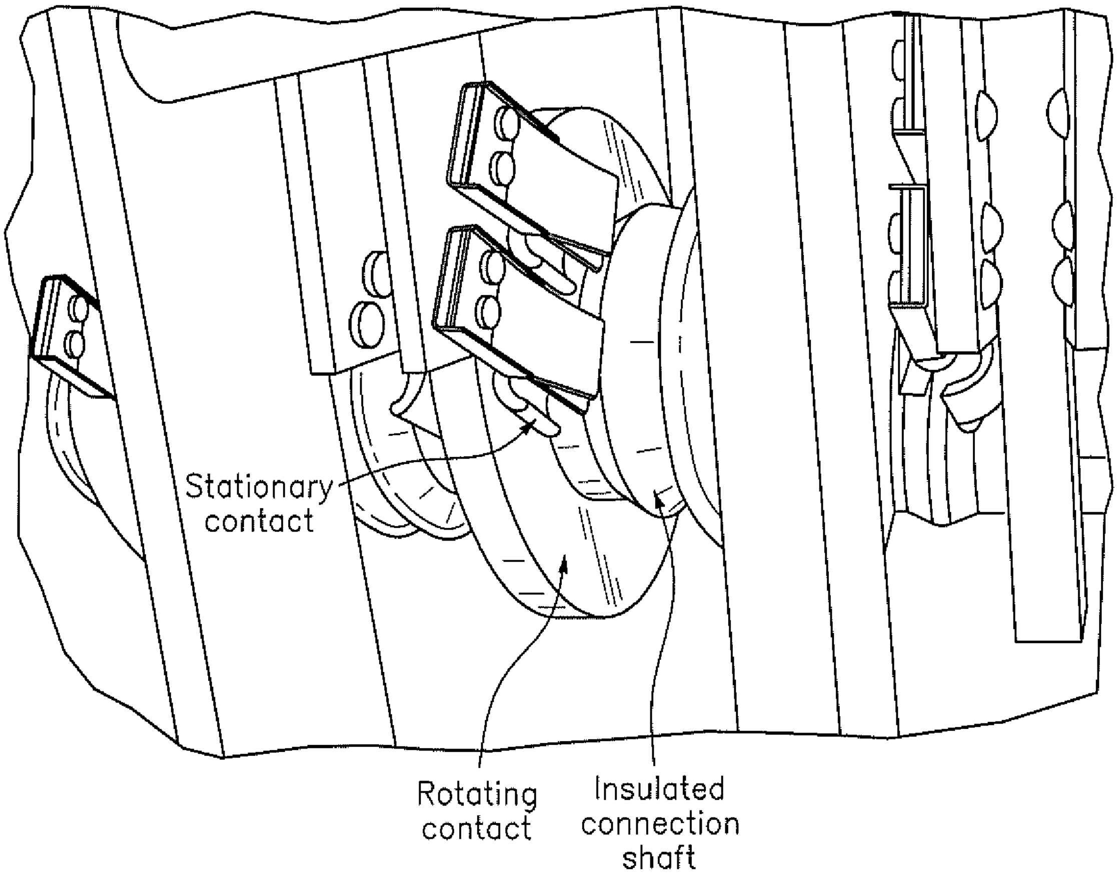
FIG. 4 depicts a close-up view of internal components within a separate primary switch compartment mounted to a network transformer.

In one embodiment, and as shown in FIGS. 9, 10, 11A, and 11B, the present invention relates generally to a controllable primary switch 24 for isolating a transformer 2 from a power grid or network (not shown), wherein the controllable primary switch 24 is mountable within and integral to the transformer 2 and is electrically connected to high voltage feeder cables to allow the transformer 2 to be disconnected from the power grid or network, the controllable primary switch 24 comprising:

a) one or more vacuum interrupters 4, wherein each of the plurality of vacuum interrupters 4 comprises:
   i) a sealed casing, the sealed casing comprising a pair of end caps 6 and 8 closing the ends of the casing; and
   first 10 and second 12 electrical switch contacts mounted inside the casing, wherein the first switch contact 10 is stationary and the second switch contact 12 is movable relative to the first switch contact 10;

b) actuator means 20 for moving the second switch contact 12 relative to the first switch contact 10 in each of the one or more vacuum interrupters 4; and c) a handle 32 connected to the actuator means 20, wherein said handle 32 is capable of engaging the actuator means 20 to move the second switch contact 12 relative to the first switch contact 10;

wherein, when the one or more vacuum interrupters 4 are in an 'open' position, the first 10 and second 12 electrical switch contacts are separated from one another, wherein the feeder cables are isolated and no power is conveyed through the transformer 2 and the transformer 2 is isolated from the power grid or network;

wherein, when the one or more vacuum interrupters 4 are in a 'closed' position, the first 10 and second 12 electrical switch contacts are in contact with each other, wherein the feeder cables are connected to the transformer 2 and power is conveyed through the transformer 2;

and wherein, another one or more vacuum interrupters 40, when 'closed', connect the feeder cables to ground.

The vacuum interrupter portion of the switch 24 of the invention comprises a tubular casing of an insulating material, such as ceramic or a suitable glass, and a pair of metallic end caps 6 and 8 that close the ends of casing, which are disposed within a cylindrical bore of the housing. The casing is generally cylindrical and forms an airtight vacuum chamber. The first 6 and second 8 end caps are sealed to the casing to render the enclosed chamber vacuum-tight. The vacuum interrupter switch 24 of the preferred embodiment is a high-voltage vacuum-type current interrupter. The vacuum interrupter switch includes an enclosure having a generally cylindrical shape. The term 'generally cylindrical' is used to refer to a housing that is substantially cylindrical but not necessarily a circular cross-section. Other cross-sections may be employed, if desired. The cylindrical enclosure includes a cylindrical bore having a vertical axis.

Furthermore, each vacuum interrupter 4 that makes up the primary switch 24 comprises an outer case formed from an electrically insulating porcelain material, such as a glazed aluminum oxide. This outer case is fully evacuated and permanently sealed during manufacture.

The end caps 6 and 8 are preferably stainless steel and are affixed to the cylindrical casing using suitable means, such as by brazing with a high temperature alloy. In this instance, the alloy is melted at the interface of the parts (like a solder) to form a vacuum-tight, hermetic seal. First 10 and second 12 switch contacts are disposed within the chamber of the casing. The contacts may have faces formed from tungsten-containing copper, pure copper, chromium-modified copper, or another suitable material.

The first switch contact 10 is disposed on the terminal end of a conductor, which passes through an aperture in the first end cap and is brazed or welded thereto. The other terminal end conductor is affixed to an upper extension conductor that is in electrical engagement with a terminal. As described herein, the first contact is the stationary contact.

The second contact 12 is the movable contact and is mounted on one terminal end of a conductor. The conductor comprises a movable contact stem or rod extending into a current interchange. The other terminal end of the movable contact rod is attached by a threaded bushing to an actuator rod mounted to an actuator means 20. The actuator rod 22 is threaded onto the threaded end of the threaded bushing. The actuator rod 22 is preferably made of an insulating or dielectric material that will not conduct the electricity passing through the conductor rod to the actuator means. Suitable materials include, but are not limited to, cellulose-filled or mineral/glass-filled phenolic, melamine, polyester, diallyl iso-phthalate, polycarbonate, or epoxy resins. In a preferred embodiment, the material is a glass-filled epoxy resin.

The present invention replaces a conventional intra-tank oil-filled primary switch with a controllable primary switch 24 that comprises one or more vacuum interrupters 4. As described herein, the under-oil open contacts of the primary switch are replaced with electrical contacts that are sealed within a vacuum environment within a porcelain housing which constitutes the vacuum interrupter. Thus, the primary switch 24 described herein provides a fully shielded set of electrical contacts that prevents any chance for an under-oil arc fault event due to a switch problem. By combination with a mechanical actuator device that does not allow the contacts to be partially or incompletely opened or closed, under-oil arcing is eliminated.

The present invention thus eliminates the need for any type of external primary switch, as well as any added connections, and reduces the risk for arcing potential associated with open switch contacts that directly contact the oil or insulating fluid inside the transformer. The vacuum interrupters 4 are fully self-contained within a vacuum housing in the transformer tank and thus any arcing resulting from the opening and closing of the vacuum interrupters within the controllable primary switch 24 can be fully isolated within the sealed vacuum housing.

By operation of the vacuum interrupters 4, power is conveyed from the incoming supply to the transformer through high voltage bushings 28, 29, and 30 when the pair of electrical contacts is in mutual contact, and no power is conveyed to the load from the incoming power supply when the pair of electrical contacts are separated from one another. In a three-position embodiment, the feeder circuit can be grounded through another one or more vacuum interrupters 40. Power exits the transformer through low voltage bushings 34, 35, and 36 connected to low voltage cables.

By 'primary switch' what is meant is a controllable switch that is capable of isolating a transformer 2 from a power grid or network so that the transformer 2 may be disconnected from the power grid or network for maintenance and testing operations or other reason.

The present invention can be designed for two-position or three-position operation, depending on customer needs. Thus, in one embodiment, the primary object of the invention is a two-position switch having a 'clear' and a 'ground' position. In another embodiment, the primary object of the invention is a three-position switch having an 'open', 'closed', and 'ground' positions. In addition, the handle 32 of the primary switch can be manually operated or, alternatively, can be motor-operated. If the primary switch is motor-operated, the motor-operators can be applied externally to the transformer tank.

As described herein, in one embodiment, the primary switch is a three-phase power system device (Phase A, Phase B, Phase C), and the one or more vacuum interrupters comprise three vacuum interrupters 4, one for each phase of the three-phase power system.

In another embodiment, instead of individual vacuum interrupters for grounding each phase, the present invention also contemplates the use of a single vacuum interrupter that is capable of grounding all three phases in parallel. Thus, in this instance, the additional vacuum interrupter would be designed to simultaneously ground all three phases.

By 'open,' what is meant is a position in which the feeder cables are isolated for de-energizing the transformer 2. Transformers are operated in this condition, for example, to allow testing of the feeder cables for fault-locating purposes. By 'closed', what is meant is a position in which the feeder cables are connected to the transformer 2. By 'ground', what is meant is a position in which the feeder cables are grounded for safety reasons.

In this embodiment, the vacuum switch 24 may comprise a second actuator means for moving the second switch contact 12 relative to the first switch contact 10 in the one or more additional vacuum interrupters 4, and a second handle connected to the second actuator means, wherein the second handle is capable of engaging the second actuator means to move the second switch contact relative to the first switch contact in each of the one or more additional vacuum interrupters.

In another embodiment, the primary switch 24 described herein includes a 'visible break' feature that allows the operator to verify the status of the switch.

In one embodiment, the actuator means 20 comprises a spring-loaded actuator, whereby the one or more vacuum interrupters 4 can be actuated to the 'open' position or the 'closed' position. It is also critical to the present invention that the one or more vacuum interrupters cannot be actuated to a partially-open or partially-closed position.

The actuator means 20 is preferably a quick-close/quick-open, motor-driven or manually-driven, over-toggle spring type device, which provides the necessary speeds and forces to adequately interrupt the load current and provides close and latch capability. Other similar actuator means 20 would also be usable in the present invention. Appropriate linkage is included to accommodate an external manual operating handle for both manual opening and closing, and positive contact position indication. The components of the mechanism are also chosen for their ability to work without lubricants. For corrosion resistance and long-maintenance-free life, it is preferable that the components are stainless steel or bronze. The components within the tank may be made with various carbon and alloy steels, bronze, or stainless steel.

The actuator means 20 reciprocates the vacuum interrupter connecting rods and thus moves the movable contact 12 away from the stationary contact 10, creating a circuit-interrupting or arcing gap between the contacts. The resulting arc, although quickly extinguished, vaporizes some of the metal on the contacts. In order to prevent this metallic vapor from condensing on the internal insulating surfaces within the chamber, a generally cylindrical, central metallic shield can be mounted within the chamber and extending along an interior axial length of tubular casing, as described, for example, in U.S. Pat. No. 5,597,992 to Walker, the subject matter of which is herein incorporated by reference in its entirety.

The controllable primary switch 24 described herein may also comprise various security features to prevent inadvertent activation of the primary switch.

In another embodiment, the primary switch 24 includes design features that enable the primary switch to be compatible with 'smart grid' electronic technology and for the primary switch to be remotely activated and operated. Thus, a sensor can be installed to remotely confirm that the switch is 'open' or 'closed' or 'grounded'. Such sensors may be interfaced through a fiber optic network using protocols developed by various control manufactures. One such control system manufacturer is Schweitzer Engineering Laboratories.

In another embodiment, and as described herein, the present invention also relates generally to a transformer tank system comprising:

a) a sealed tank, said sealed tank comprising core and coil assemblies 26 immersed in a dielectric fluid or air or inert gas within the tank; and b) a controllable primary switch 24 for isolating a transformer 2 from a power grid or network, wherein the controllable primary switch 24 is mountable within the sealed tank and is electrically connected to high voltage feeder cables to allow the transformer 2 to be disconnected from the power grid or network, or for grounding the primary connection, the controllable primary switch 24 comprising:

i) one or more vacuum interrupters 4, wherein each of the plurality of vacuum interrupters 4 comprises:

(a) a sealed casing, the sealed casing comprising a pair of end caps 6 and 8 closing the ends of the casing; and (b) first 10 and second 12 electrical switch contacts mounted inside the casing, wherein the first switch contact 10 is stationary and the second switch contact 12 is movable relative to the first switch contact 10;

ii) actuator means 20 for moving the second switch contact 12 relative to the first switch contact 10 in each of the one or more vacuum interrupters 4; and iii) a handle 32 connected to the actuator means 20, wherein said handle 32 is capable of engaging the actuator means 20 to move the second switch contact 12 relative to the first switch contact 10;

wherein, when the one or more vacuum interrupters 4 are in an 'open' position, the first 10 and second 12 electrical switch contacts are separated from one another, wherein the feeder cables are isolated and no power is conveyed through the transformer 2 and the transformer 2 is isolated from the power grid or network;

wherein, when the one or more vacuum interrupters 4 are in a 'closed' position, the first 10 and second 12 electrical switch contacts are in contact with each other, wherein the feeder cables are connected to the transformer 2 and power is conveyed through the transformer 2 and wherein one or more vacuum interrupters 4, when in a 'closed' position, connect the feeder circuit to ground.

By integrating the switch 24 and transformer 2, a fully integrated product can be designed, from the outset, to provide maximum protection against an under-oil arcing fault or arcing fault within a 'dry type' transformer tank. This fully integrated design can be used in combination with a fault-tolerant transformer design, as described, for example in co-pending application Ser. No. 14/931,144 to Groeger et al., the subject matter of which is herein incorporated by reference in its entirety. This fully integrated design is also compatible with standard designs.

The switch 24 described herein does not have any protective response in the sense of a circuit breaker, for example. It is a device intended only for establishing, isolating, and/or grounding the feeder circuit.

The mechanism must be robust, to allow simultaneous switching of each phase, and to make the switching action as fast and as smooth as possible to prevent arc-carryover due to slow opening or closing of the contacts.

The transformer tank optionally, but preferably, comprises means for verifying the position of the at least one primary switch 24 in either the 'open' or the 'closed' or 'ground' position. In one embodiment, the means for verifying the position of the at least one primary switch may comprise a transparent viewing window. In another embodiment, the means for verifying the position of the at least one primary switch may comprises a sensor or other device that is capable of providing feedback to a user to confirm the position of the at least one primary switch.

The controllable primary switch 24 may be manually-actuated or remotely-actuated. In one embodiment the primary switch 24 is configured to allow for remote switching capability, which enables the primary switch to be fully smart grid compliant.

The transformer tank system described herein may also comprise one or more sensors to monitor conditions in the transformer tank system. Various visible and audible alarms and control actions may be operatively connected to the one or more sensors to provide feedback if operating conditions exceed prescribed parameters. These one or more sensors may monitor, for example, temperature, ground current, seismic/vibration magnitude, oil level, oil pressure, and oil temperature, among others. In one embodiment, the seismic/vibration sensor may include, for example, an accelerometer, such as a microelectromechanical systems (MEMS)

accelerometer, or a seismometer. In one aspect, if seismic activity is determined to exceed a threshold level, then the utility service can be disconnected.

Various security features may also be included in the transformer tank system to provide remote access and/or to prevent unauthorized intrusion.

In still another embodiment, it may be desirable to retrofit a transformer tank system to replace an existing primary switch with the controllable primary switch 24 described herein. In this embodiment, the present invention also relates generally to a kit for retrofitting a transformer tank system to provide a controllable primary switch 24 in a sealed tank of the transformer tank system, the kit comprising:

the controllable primary switch 24 for isolating a transformer 2 from a power grid or network, the controllable primary switch 24 comprising:

a) one or more vacuum interrupters 4, wherein each of the plurality of vacuum interrupters 4 comprises:

i) a sealed casing, the sealed casing comprising a pair of end caps 6 and 8 closing the ends of the casing; and ii) first 10 and second 12 electrical switch contacts mounted inside the casing, wherein the first switch contact 10 is stationary and the second switch contact is movable relative to the first switch contact;

b) actuator means 20 for moving the second switch contact 12 relative to the first switch contact 10 in each of the one or more vacuum interrupters 4; and c) a handle 32 connected to the actuator means 20, wherein said handle 32 is capable of engaging the actuator means 20 to move the second switch contact 12 relative to the first switch contact 10;

wherein the controllable primary switch 24 is enclosed within a housing and is mountable within the sealed tank and is electrically connectable to high voltage feeder cables to allow the transformer 2 to be disconnected from the power grid or network.

In still another embodiment, the present invention relates generally to a method of isolating a transformer from a power grid or network using a controllable primary switch, wherein the primary switch is mounted within and integral to a sealed transformer tank, wherein the controllable primary switch comprises (a) one or more vacuum interrupters, wherein each of the plurality of vacuum interrupters comprises (i) a sealed casing, the sealed casing comprising a pair of end caps closing the ends of the casing; and (ii) first and second electrical switch contacts mounted inside the casing, wherein the first switch contact is stationary and the second switch contact is movable relative to the first switch contact; (b) actuator means for moving the second switch contact relative to the first switch contact in each of the one or more vacuum interrupters; and c) a handle connected to the actuator means, wherein said handle is capable of engaging the actuator means to move the second switch contact relative to the first switch contact; the method comprising the steps of:

engaging the handle to engage the actuator means to move the second switch contact relative to the first switch contact;

wherein in an 'open' position, the first and second electrical switch contacts are separated from one another, wherein the feeder cables are isolated and no power is conveyed through the transformer and the transformer is isolated from the power grid or network; and wherein in a 'closed' position, the first and second electrical switch contacts are in contact with each other, wherein the feeder cables are connected to the transformer and power is conveyed through the transformer; and wherein in a 'ground' position, the feeder circuit is connected through the corresponding one or more vacuum interrupters to ground.

The primary switch described herein can be used with a variety of transformer types, including network transformers and pad-mounted transformers, using insulating fluid or with dry type insulation systems. In a preferred embodiment, the primary switch is used with a network transformer, insulated with oil or other suitable fluid.

The tank system of the invention may include a viewing window that is incorporated into the outer wall that allows personnel to visually inspect the position of the vacuum interrupter within the sealed case and determine if the particular vacuum interrupter is in an 'open', 'closed' or 'grounded' position within the sealed case. Personnel may also be able to manually change the position of the switch, such as from 'open' to 'close' or 'close' to 'open', if necessary. Thus, it is desirable that the primary switch includes a visible break feature that allows for visual confirmation of the switch position.

In one embodiment, the switch comprises a lock-out relay to prevent grounding in the event that the transformer is back-fed from the secondary side. In the 'ground' position, the under-oil or intra-tank switch further comprises a manual locking feature that would prevent any inadvertent remote operation thereof.

Figure 5:
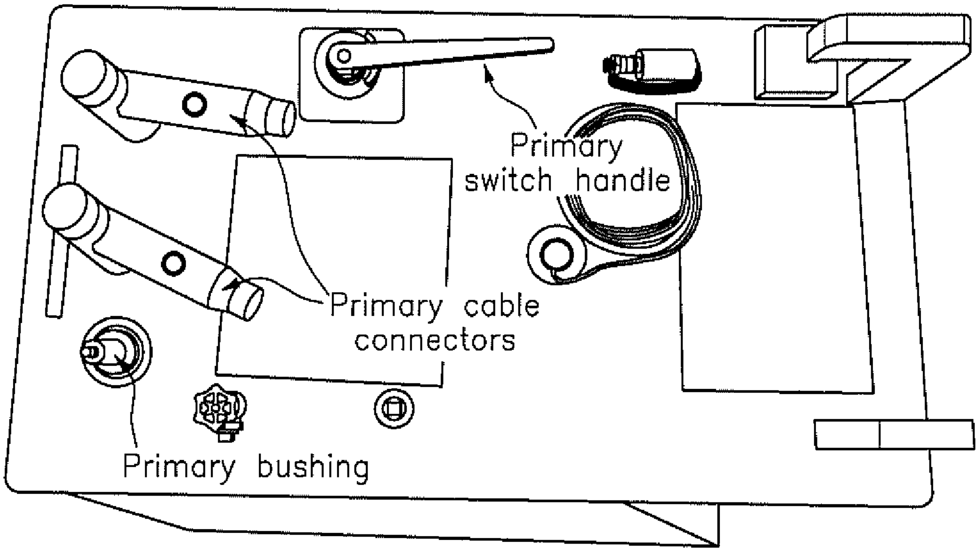
FIG. 5 depicts a network transformer showing the location of the handle for the primary switch, as well as the connections for the incoming high voltage cables.

FIG. 5 depicts a top-down view of a network transformer in accordance with the present invention showing one location of the handle for the primary switch 24, as well as the connections (i.e. primary bushings) for the incoming high voltage cables.

Figure 6:
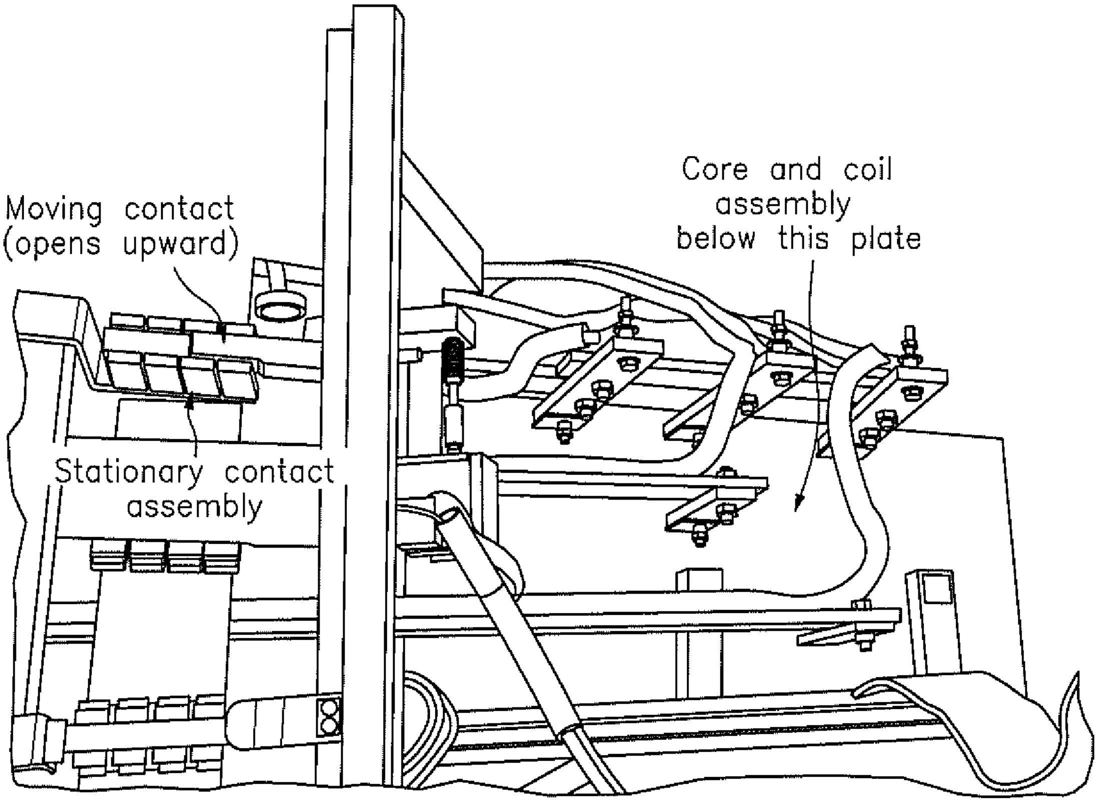
FIG. 6 (PRIOR ART)
FIG. 6 depicts a primary switch and related contacts.

FIG. 6 depicts a traditional primary switch and related contacts of the prior art.

Figure 7:
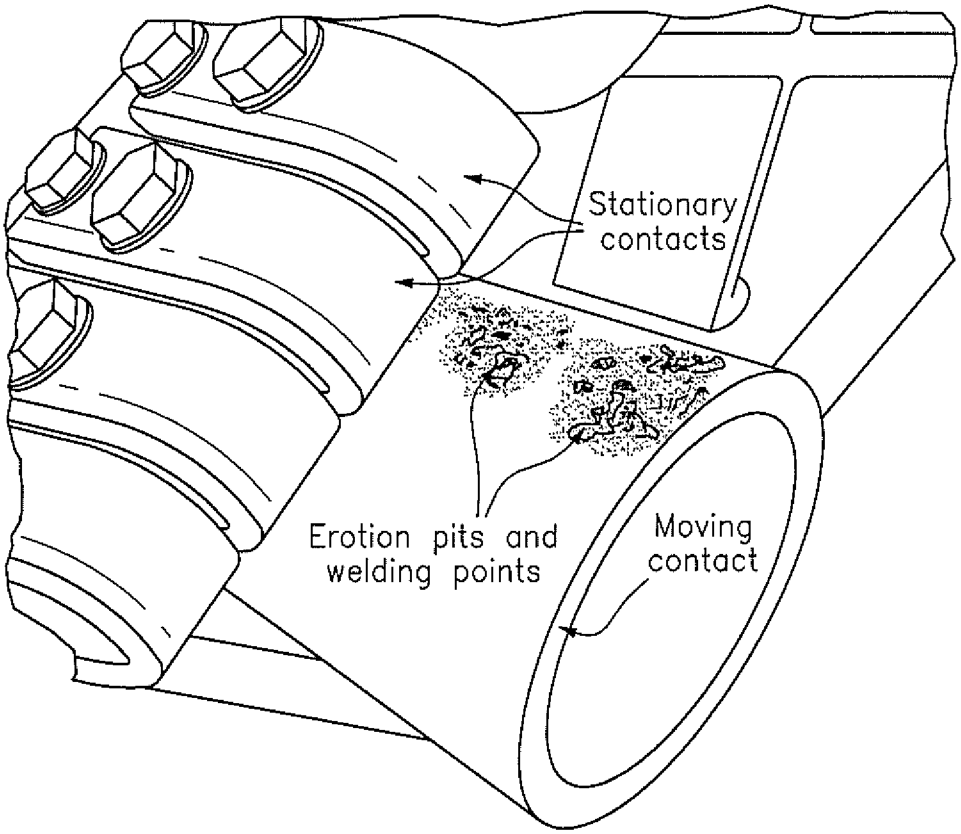
FIG. 7 (PRIOR ART)
FIG. 7 depicts a manually-operated switch showing considerable arcing and erosion damage to the fixed and moving contacts.

FIG. 7 depicts a switch of the prior art depicting considerable arcing damage to the fixed and moving contacts. This switch was operated incorrectly, resulting in the contacts not being fully closed. Arcing across the gap caused major contact erosion and localized welding. This is a good example of the benefits of the invention described herein. Because the contacts are protected inside a vacuum environment and have a positive-close and positive-open spring-loaded switch action, it is not possible to 'hang' the switch in a partially-open or partially-closed position.

Figure 8:
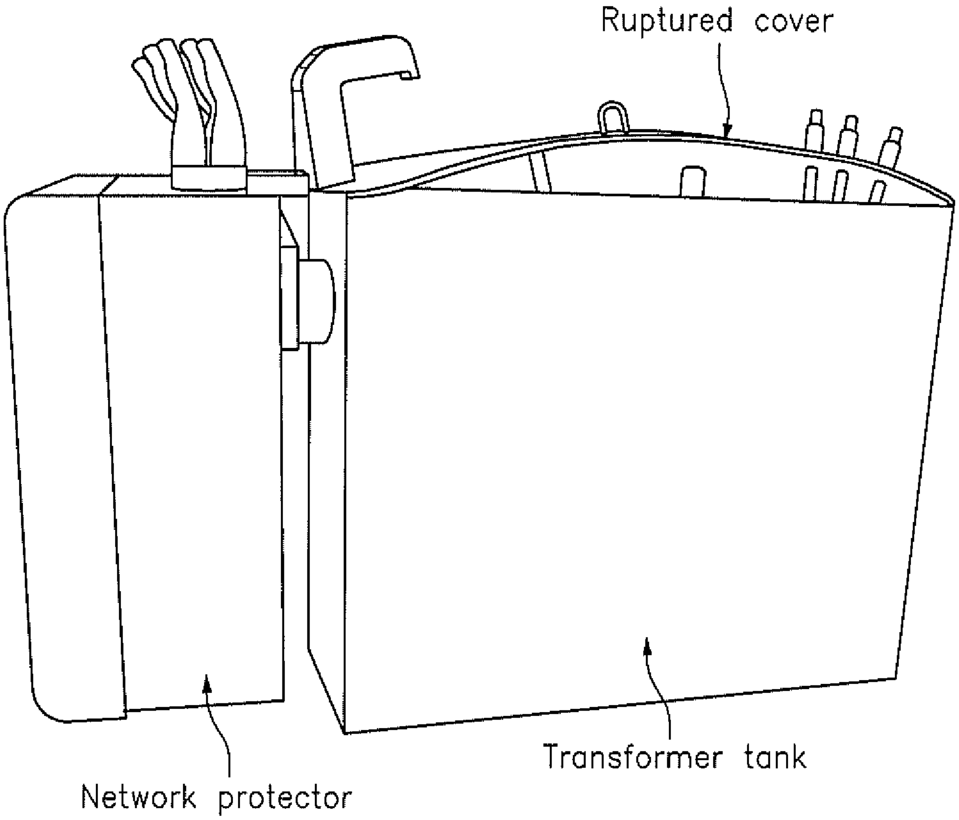
FIG. 8 depicts a ruptured cover of a transformer tank.

FIG. 8 depicts a ruptured cover of a transformer tank and illustrates the magnitude of the concerns that we want to overcome by having a protected primary switch as described herein. As is readily apparent, it is highly desirable to have a primary switch that is not subject to premature failure and that does not contribute to a major internal pressurization event.

Figure 9:
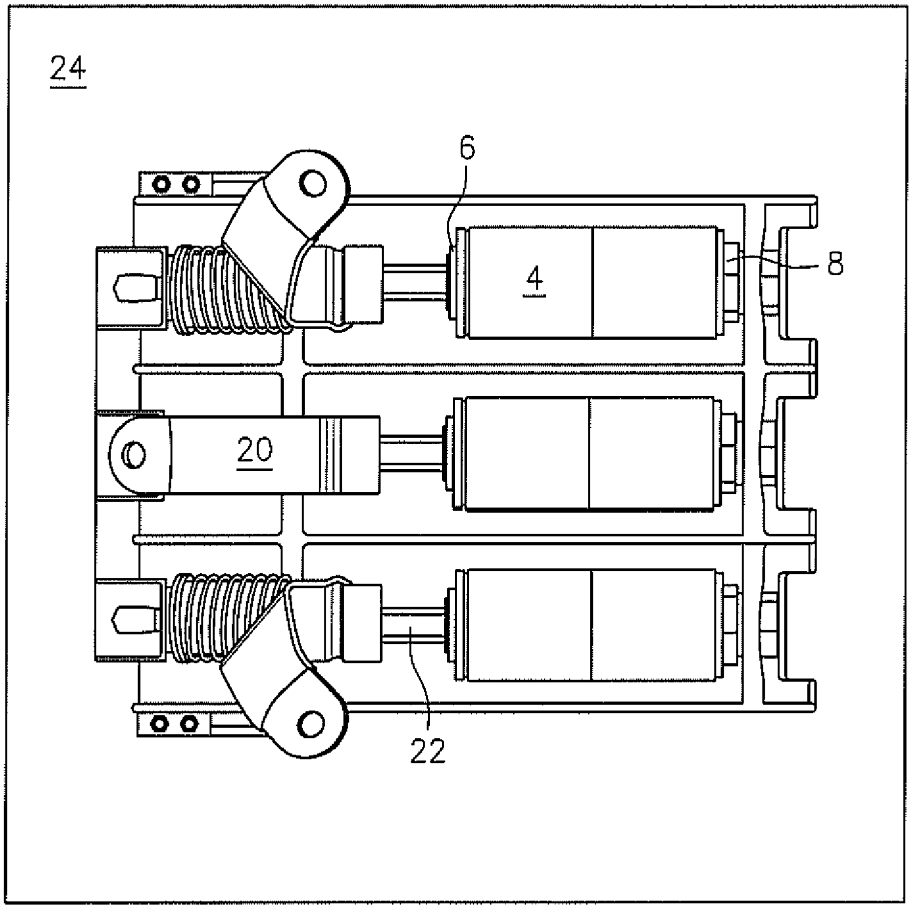
FIG. 9 shows three parallel vacuum interrupters arranged as a three-phase switch.

FIG. 9 shows three parallel vacuum interrupters 4 arranged as a three-phase switch in accordance with the present invention. The interrupters 4 have electrical contacts that are enclosed by the white porcelain housings. Vacuum is maintained by using a bellows seal around the moving contact shaft. A second set of one or more interrupters would be needed in order to have a grounding feature.

As can be seen, there is no open are exposed to the oil in which the vacuum interrupters are immersed or to the gas space inside a dry type transformer.

Figure 10:
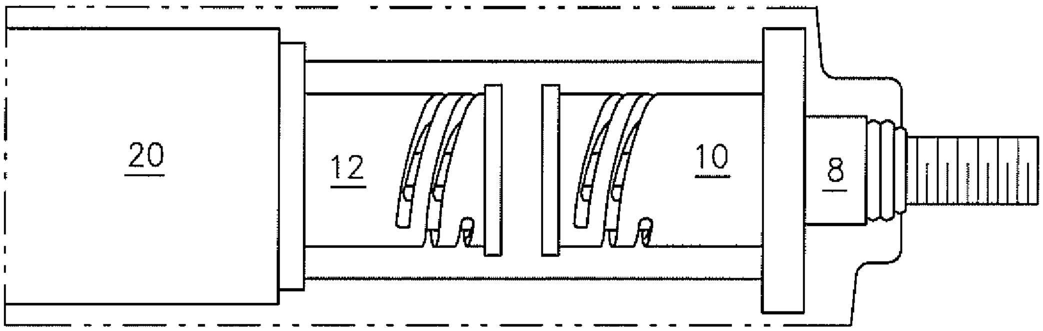
FIG. 10 depicts a typical vacuum interrupter with the external porcelain housing partially cut away.
Figure 11A:
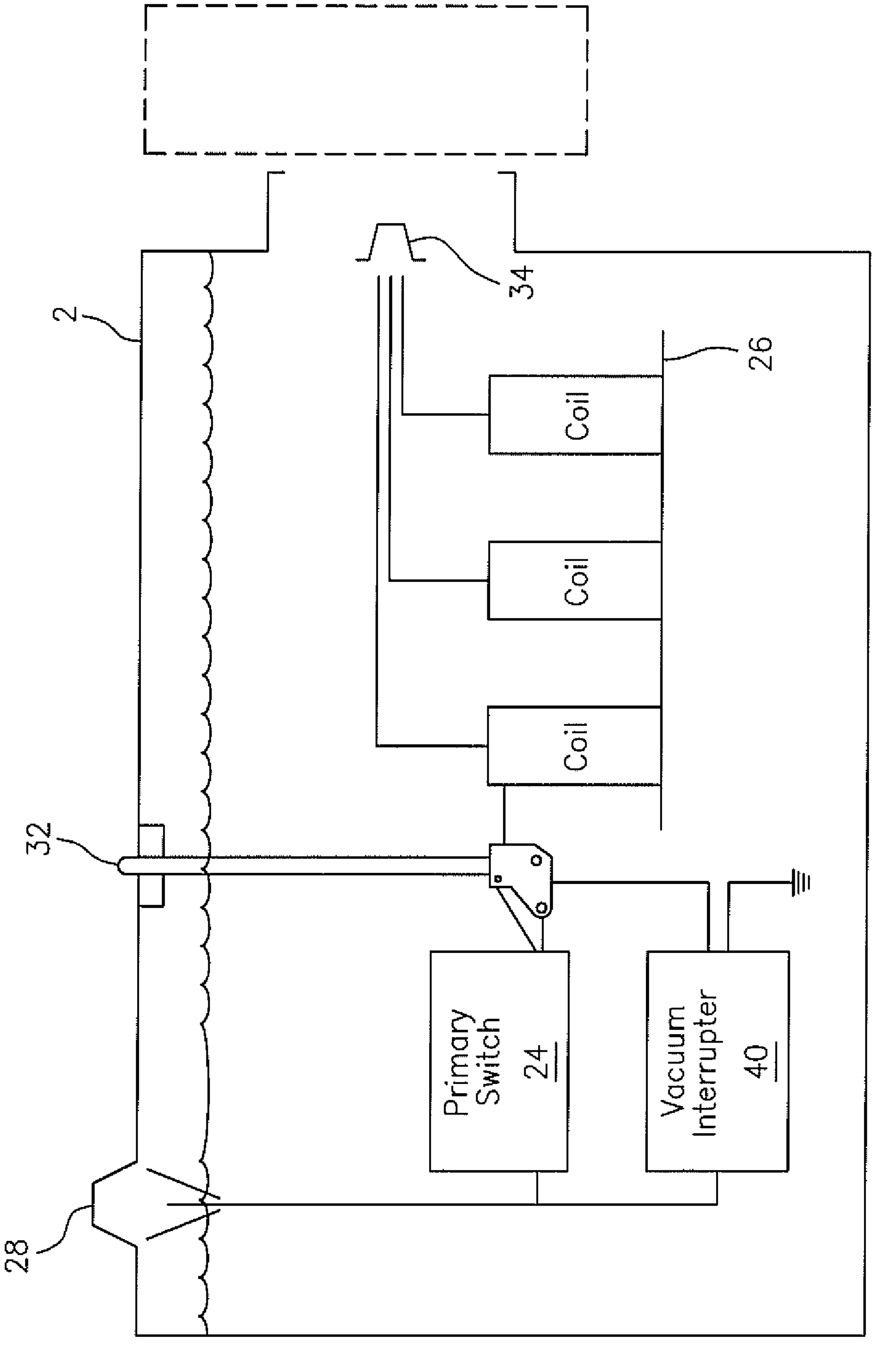
FIG. 11A depicts a side view of a transformer with an intra-tank under-oil vacuum primary switch in accordance with the present invention.
Figure 11B:
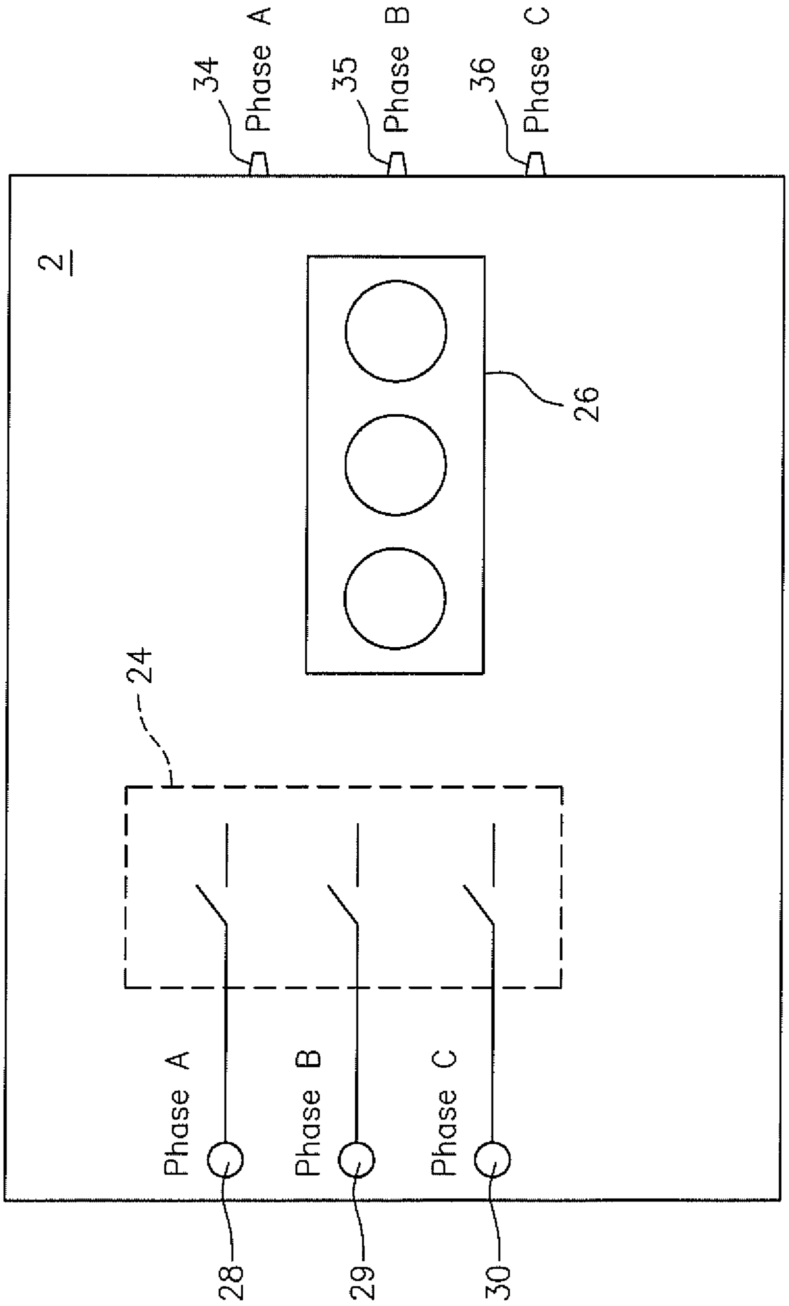
FIG. 11B depicts a top view of transformer with an intra-tank under-oil vacuum primary switch in accordance with the present invention.

FIG. 10 depicts another view of the vacuum. Both of the mating contact faces can be seen in this view.

What is claimed is:

1. A transformer tank system comprising:

a) a sealed tank, said sealed tank comprising core and coil assemblies immersed in a dielectric fluid or gas within the tank;

b) a heat exchanger capable of circulating the dielectric fluid or gas within the sealed tank as the dielectric fluid increases in temperature and expands within the sealed tank, wherein the heat exchanger comprises:
a hollow panel comprising a first side and a second side, wherein the second side of the hollow panel is connected to the sealed transformer tank at a plurality of ports;
wherein heated dielectric fluid or gas circulates into the heat exchanger from the transformer tank through a first port and cooled dielectric fluid or gas exits the heat exchanger through a second port back to the transformer tank;
wherein the hollow panel is capable of expanding in volume to contain electric fault energy that produce a sudden generation of gases which increases the pressure inside the heat exchanger;
wherein the heat exchanger comprises a plurality of constraints, said plurality of constraints being capable of minimizing deformation of the heat exchanger when the heat exchanger expands in volume; and
wherein the heat exchanger is configured to provide full containment of a catastrophic event with no leaks or ruptures; and c) a controllable primary switch configured to isolate a transformer from a power grid or network, wherein the controllable primary switch is mountable within the sealed tank and is electrically connected to high voltage feeder cables to allow the transformer to be disconnected from the power grid or network, the controllable primary switch comprising:
i) one or more vacuum interrupters, wherein each of the plurality of vacuum interrupters comprises:
(a) a sealed casing, the sealed casing comprising a pair of end caps closing the ends of the casing; and
(b) first and second electrical switch contacts mounted inside the casing, wherein the first switch contact is stationary and the second switch contact is movable relative to the first switch contact;
ii) an actuator, wherein the actuator moves the second switch contact relative to the first switch contact in each of the one or more vacuum interrupters; and
iii) a handle connected to the actuator, wherein said handle is capable of engaging the actuator to move the second switch contact relative to the first switch contact;

wherein, when the one or more vacuum interrupters are in an open position, the first and second electrical switch contacts are separated from one another, wherein the feeder cables are isolated and no power is conveyed through the transformer and the transformer is isolated from the power grid or network; and
wherein, when the one or more vacuum interrupters are in a closed position, the first and second electrical switch contacts are in contact with each other, wherein the feeder cables are connected to the transformer and power is conveyed through the transformer.

2. The transformer tank system according to claim 1, wherein the transformer is a three-phase power system, and wherein the one or more vacuum interrupters comprises three vacuum interrupters, one for each phase of the three-phase power system.

3. The transformer tank system according to claim 2, wherein the transformer is a three-phase power system,
wherein the one or more vacuum interrupters comprises another component of the switch that is capable of moving the feeder circuit from a closed position to a grounded position,
wherein, when the additional vacuum interrupters are in an open position, the first and second electrical switch contacts are separated from one another, wherein the feeder cables are isolated and no power is conveyed through the transformer and the transformer is isolated from the power grid or network; and
wherein, when the additional vacuum interrupters are in a closed position, the first and second electrical switch contacts are in contact with each other, wherein the feeder cables are grounded.

4. The transformer tank system according to claim 3, wherein the actuator is a spring-loaded actuator, wherein the one or more vacuum interrupters are capable of being actuated to the open position, the closed position, or the ground position, wherein the one or more vacuum interrupters cannot be actuated to a partially-open or partially-closed position.

5. The transformer tank system according to claim 1, wherein the actuator is a spring-loaded actuator, wherein the one or more vacuum interrupters are capable of being actuated to the open position or the closed position, wherein the one or more vacuum interrupters cannot be actuated to a partially-open or partially-closed position.

6. The transformer tank system according to claim 1, wherein the primary switch is configured for remote activation.

7. The transformer tank system according to claim 1, comprising a security feature to prevent inadvertent activation of the primary switch.

8. The transformer tank system according to claim 1, comprising a transparent viewing window for viewing the at least one primary switch to verify the position of the at least one primary switch in either the open or the closed position.

9. The transformer tank system according to claim 1, wherein the controllable primary switch is configured to be manually-actuated or remotely-actuated.

10. The transformer tank system according to claim 1, further comprising a plurality of sensors to monitor conditions within the transformer tank system.

11. A transformer tank system comprising:
a) a sealed tank, said sealed tank comprising core and coil assemblies immersed in a dielectric fluid or gas within the tank;
b) a heat exchanger capable of circulating the dielectric fluid or gas within the sealed tank as the dielectric fluid increases in temperature and expands within the sealed tank, wherein the heat exchanger comprises:
a hollow panel comprising a first side and a second side, wherein the second side of the hollow panel is connected to the sealed transformer tank at a plurality of ports;
wherein heated dielectric fluid or gas circulates into the heat exchanger from the transformer tank through a first port and cooled dielectric fluid or gas exits the heat exchanger through a second port back to the transformer tank;
wherein the hollow panel is capable of expanding in volume to contain electric fault energy that produce a sudden generation of gases which increases the pressure inside the heat exchanger;
wherein the heat exchanger comprises a preferred release notch on a lower edge of the hollow panel, wherein the preferred release notch comprises a wedge piece that is welded between a notched lower edge of the first side and the second side of the hollow panel, and wherein the wedge piece tapers to a tip at an upper edge of the preferred release notch between the first side and the second side, wherein when the dielectric fluid becomes heated and pressure inside the heat exchanger exceeds a rupture pressure of the heat exchanger, a controlled pressure release preferentially initiates at the upper edge of the preferred release notch of the heat exchanger, wherein the preferred release notch is configured to provide a progressive opening that can gradually widen as the pressure intensifies; and c) a controllable primary switch configured to isolate a transformer from a power grid or network, wherein the controllable primary switch is mountable within the sealed tank and is electrically connected to high voltage feeder cables to allow the transformer to be disconnected from the power grid or network, the controllable primary switch comprising:

i) one or more vacuum interrupters, wherein each of the plurality of vacuum interrupters comprises:

(a) a sealed casing, the sealed casing comprising a pair of end caps closing the ends of the casing; and (b) first and second electrical switch contacts mounted inside the casing, wherein the first switch contact is stationary and the second switch contact is movable relative to the first switch contact;

ii) an actuator, wherein the actuator moves the second switch contact relative to the first switch contact in each of the one or more vacuum interrupters; and iii) a handle connected to the actuator, wherein said handle is capable of engaging the actuator to move the second switch contact relative to the first switch contact;

wherein, when the one or more vacuum interrupters are in an open position, the first and second electrical switch contacts are separated from one another, wherein the feeder cables are isolated and no power is conveyed through the transformer and the transformer is isolated from the power grid or network; and wherein, when the one or more vacuum interrupters are in a closed position, the first and second electrical switch contacts are in contact with each other, wherein the feeder cables are connected to the transformer and power is conveyed through the transformer.

12. The transformer tank system according to claim 11, wherein the transformer is a three-phase power system, and wherein the one or more vacuum interrupters comprises three vacuum interrupters, one for each phase of the three-phase power system.

13. The transformer tank system according to claim 12, wherein the transformer is a three-phase power system, wherein the one or more vacuum interrupters cannot be actuated to a partially-open or partially-closed position, wherein the one or more vacuum interrupters comprises another component of the switch that is capable of moving the feeder circuit from a closed position to a grounded position, wherein, when the additional vacuum interrupters are in an open position, the first and second electrical switch contacts are separated from one another, wherein the feeder cables are isolated and no power is conveyed through the transformer and the transformer is isolated from the power grid or network; and wherein, when the additional vacuum interrupters are in a closed position, the first and second electrical switch contacts are in contact with each other, wherein the feeder cables are grounded.

14. The transformer tank system according to claim 13, wherein the actuator is a spring-loaded actuator, wherein the one or more vacuum interrupters are capable of being actuated to the open position, the closed position, or the ground position, and wherein the one or more vacuum interrupters cannot be actuated to a partially-open or partially-closed position.

15. The transformer tank system according to claim 11, wherein the actuator is a spring-loaded actuator, wherein the one or more vacuum interrupters are capable of being actuated to the open position or the closed position, and wherein the one or more vacuum interrupters cannot be actuated to a partially-open or partially-closed position.

16. The transformer tank system according to claim 11, wherein the controllable primary switch is configured to be manually-actuated or remotely-actuated.

17. The transformer tank system according to claim 16, further comprising a plurality of sensors to monitor conditions in the transformer tank system.

* * * * *